United States Patent
Keeton et al.

(10) Patent No.: US 7,070,660 B2
(45) Date of Patent: Jul. 4, 2006

(54) WAFER HOLDER WITH STIFFENING RIB

(75) Inventors: Tony J. Keeton, Mesa, AZ (US);
Matthew G. Goodman, Chandler, AZ (US)

(73) Assignee: ASM America, Inc., Phoenix, AZ (US)

( * ) Notice: Subject to any disclaimer, the term of this patent is extended or adjusted under 35 U.S.C. 154(b) by 422 days.

(21) Appl. No.: 10/139,098

(22) Filed: May 3, 2002

(65) Prior Publication Data
US 2003/0205324 A1    Nov. 6, 2003

(51) Int. Cl.
*H01L 21/00* (2006.01)
*C23C 16/00* (2006.01)

(52) U.S. Cl. ............... 118/725; 118/728; 118/724; 118/500; 156/345.51; 156/345.52; 204/192.1; 204/298.01

(58) Field of Classification Search ............ 118/725, 118/726, 724, 728, 500; 156/345, 345.51, 156/345.52; 204/192.1, 298.01
See application file for complete search history.

(56) References Cited

U.S. PATENT DOCUMENTS

| | | | |
|---|---|---|---|
| 4,978,567 A | 12/1990 | Miller | |
| 5,198,034 A | 3/1993 | deBoer et al. | |
| 5,245,152 A | 9/1993 | McCall | |
| 5,403,401 A | 4/1995 | Haafkens et al. | |
| 5,514,439 A * | 5/1996 | Sibley | 428/64.1 |
| 5,800,623 A * | 9/1998 | Dyer | 118/728 |
| 6,113,702 A | 9/2000 | Halpin et al. | |
| 6,203,622 B1 | 3/2001 | Halpin et al. | |
| 6,245,152 B1 * | 6/2001 | Imai et al. | 118/728 |
| 6,266,133 B1 * | 7/2001 | Miyajima et al. | 355/72 |
| 2002/0023590 A1 * | 2/2002 | Storbeck | 118/725 |

FOREIGN PATENT DOCUMENTS

JP    2002033284 A  *  1/2002

* cited by examiner

*Primary Examiner*—Ram N Kackar
(74) *Attorney, Agent, or Firm*—Knobbe Martens Olson & Bear LLP

(57) ABSTRACT

A wafer holder comprises a circular, disc-shaped main portion and a rib extending generally downward from a lower surface of the main portion. The rib encircles the vertical center axis of the wafer holder. The upper surface of the main portion has a wafer-receiving pocket defined by an inner pocket surface surrounded by an outer shoulder. The rib is closed to completely surround a vertical center axis of the main portion. The rib helps to prevent the main portion from inducing symmetric concavity during the manufacture of the wafer holder. In other words, the rib helps to maintain the flatness of the upper surface of the outer shoulder while the main portion is made symmetrically concave.

24 Claims, 4 Drawing Sheets

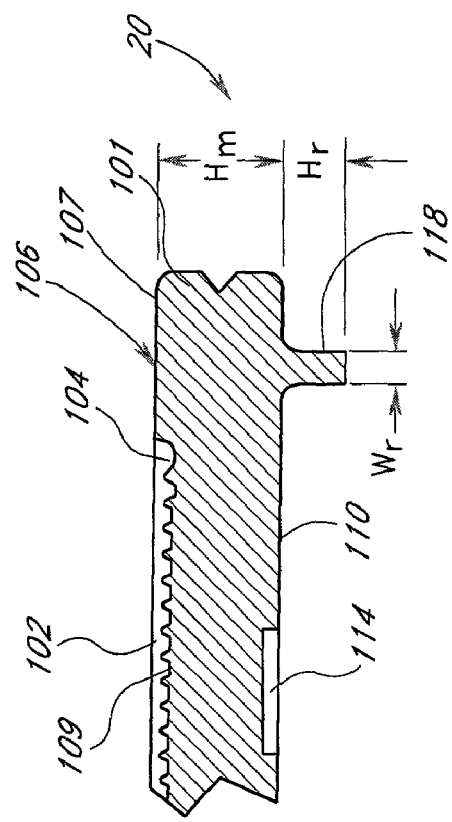
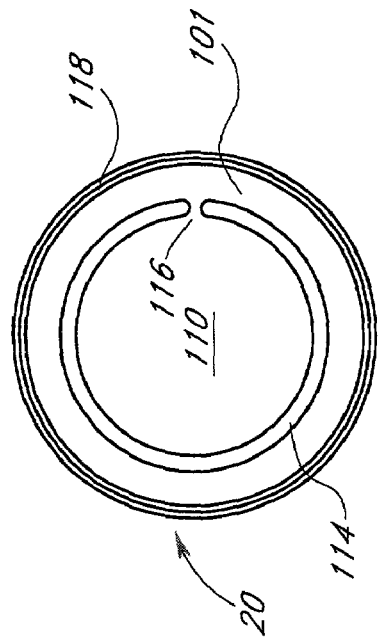
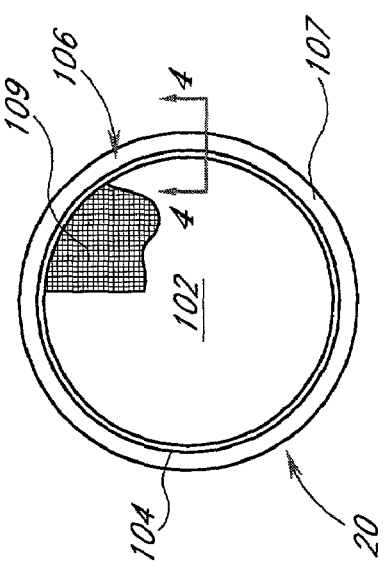

WAFER HOLDER WITH STIFFENING RIB

INCORPORATION BY REFERENCE

The present application hereby incorporates by reference the entire disclosures of the following: (1) U.S. Pat. No. 6,053,982, entitled "Wafer Support System;" (2) U.S. Patent Application Publication No. U.S. 2003/0168174 A1, entitled "Gas Cushion Susceptor System;" (3) U.S. Pat. No. 6,634,882, entitled "Susceptor Pocket Profile to Improve Pocket Performance;" and (4) U.S. Pat. No. 4,821,674, entitled "Rotatable Substrate Supporting Mechanism with Temperature Sensing Device for Use in Chemical Vapor Deposition Equipment."

BACKGROUND OF THE INVENTION

1. Field of the Invention

This invention relates generally to the processing of wafers within semiconductor processing chambers and, more particularly, to a wafer holder that effects a more uniform temperature distribution across a wafer held thereon.

2. Description of the Related Art

High-temperature ovens, or reactors, are used to process semiconductor wafers from which integrated circuits are made for the electronics industry. A substrate, typically a circular silicon wafer, is placed on a wafer holder. If holder helps to attract heat, it is called a susceptor. The wafer and wafer holder are enclosed in a quartz chamber and heated to high temperatures, such as 600–1200° C. or even higher, by a plurality of radiant lamps placed around the quartz chamber. In one process, a reactant gas is passed over the heated wafer, causing the chemical vapor deposition (CVD) of a thin layer of the reactant material on the wafer. Through subsequent processes, these layers are made into integrated circuits, with a single layer producing from tens to thousands of integrated circuits, depending on the size of the wafer and the complexity of the circuits. In recent years, single-wafer processing has grown for a variety of reasons, including its greater precision as opposed to processing batches of wafers at the same time, while larger diameter wafers are employed to compensate for reduced throughput as compared to batch processing.

Various CVD process parameters must be carefully controlled to ensure the high quality of the resulting semiconductor. One such parameter is the temperature profile across the wafer during processing. The deposition gas reacts at particular temperatures and deposits on the wafer. If the temperature varies greatly across the surface of the wafer, uneven deposition of the reactant gas occurs. Similarly, temperature uniformity can be important for a variety of other semiconductor fabrication processes, such as etching, annealing, doping, etc.

A variety of different types of wafer holders exist. In one design, an upper surface of the wafer holder includes a wafer-receiving pocket or recess sized and adapted to receive a wafer of a particular size. The recess is defined by an outer shoulder circumscribing an inner pocket surface that is lower than the shoulder's upper surface. The upper surface of the wafer holder may include a grid formed by a plurality of intersecting grooves in the inner pocket surface. By permitting gas flow around the edges of and underneath the wafer, the grooves facilitate wafer pickup from the surface of the wafer holder. The grooves thereby avoid suction between the wafer and the wafer holder and thereby prevent the wafer from sticking to the wafer holder. Similarly, the channels inhibit wafer slide during wafer drop off, permitting gas to compress underneath and escape around the wafer edges without forming a cushion. The wafer holder is typically formed of graphite and coated with silicon carbide, which is relatively inert, durable, absorbs radiant heat and helps to prevent graphite particles from flaking off of the wafer holder and contaminating the reactor environment. Advantageously, silicon carbide has an ultra high purity.

A typical process of manufacturing a wafer holder involves forming the part from graphite, possibly with the wafer-receiving recess and/or grid structure therein. The part is then heated to a temperature as high as 1600–1700° C., to remove impurities (metals, etc.) and/or gases from within the graphite, and then permitted to cool. Then, in a separate high temperature process, the part is coated with silicon carbide and subsequently annealed. Advantageously, the coating closely conforms to and seals the graphite after outgassing.

During the cooling step, it has been found that wafer holders having certain configurations tend to form slight concavities on one surface. This is often referred to as "dishing." In particular, if a wafer holder has a larger surface area on its upper surface (on which the wafer is held) than its lower surface, a concavity will form within the upper surface. One type of wafer holder that exhibits this property is the aforementioned design having a grid structure in its upper surface and a generally flat bottom surface. In this design, a concavity is formed in the upper surface of the wafer-receiving pocket. The concavity is caused by a differential in thermal expansion between the graphite core and the silicon carbide coating. In particular, the coefficient of thermal expansion of silicon carbide is greater than that of graphite. If the silicon carbide had a lower coefficient of thermal expansion, the wafer holder would dish or bow in the opposite direction. One advantage of using a ceramic coating material, such as silicon carbide, having a coefficient of thermal expansion larger than that of graphite is that, in the finished wafer holder, the ceramic coating is in a state of compression. Ceramic materials are known to be stronger in compression.

One problem that has been encountered is that wafer holders tend to assume a "saddle" shape during manufacturing and/or wafer processing. Saddling is a form of dishing in which the formed concavity is not uniform. In a saddled wafer holder, the upper surface of the outer shoulder is not flat. Rather, it has opposing high points and low points, such as the edge of a potato chip. In other words, a "saddle shape" is one having two high edges and two low edges on a surface. Saddling of the wafer holder tends to result in temperature non-uniformities across the wafer surface.

In order to avoid the concavity, some manufacturers have attempted to minimize the surface area differential by forming an additional grid structure on the bottom surface of the wafer holder. See, e.g., U.S. Pat. No. 5,403,401, issued Apr. 4, 1994 to Haafkens et al. Such a bottom side grid can interfere thermally and mechanically with normal operation of the susceptor in the reactor, and moreover doubles the amount of fine machining required for production.

Accordingly, a need exists for improved susceptors and processes of forming the same that avoid the advent of saddling.

SUMMARY OF THE INVENTION

Accordingly, it is a principal object and advantage of the present invention to provide an improved wafer holder that overcomes the aforementioned problems associated with the prior art.

In one aspect, the present invention provides a wafer holder comprising a main portion and a rib. The main portion has an upper surface and a lower surface. The ratio of the surface area of the upper surface to the surface area of the lower surface is greater than about 2.0. The rib is formed on and protrudes generally downward from the lower surface of the main portion. Also, the rib is closed to completely encircle a vertical center axis of the main portion.

In another aspect, the present invention provides a wafer holder comprising a main portion and a rib. The main portion has an upper surface and a lower surface. The upper surface includes a grid formed by intersecting grooves in the upper surface. The rib is integral with and protrudes generally vertically from the main portion.

In another aspect, the present invention provides a cold wall reactor for processing semiconductor wafers, comprising a reaction chamber, an upper array of radiant heat elements above the reaction chamber, a lower array of radiant heat elements below the reaction chamber, and a wafer holder inside the reaction chamber. The wafer holder comprises a main portion and a rib. The main portion has an upper surface and a lower surface. The ratio of the surface area of the upper surface to the surface area of the lower surface is greater than about 2.0. The rib is secured to and protrudes generally vertically from the main portion. Also, the rib is closed to completely surround a vertical center axis of the main portion.

In another aspect, the present invention provides a cold wall reactor for processing semiconductor wafers, comprising a reaction chamber, an upper array of radiant heat elements above the reaction chamber, and a wafer holder inside the reaction chamber. The wafer holder comprises a main portion and a rib. The main portion has an upper surface and a lower surface. The upper surface includes a grid formed by intersecting grooves in the upper surface. The rib is secured to and protrudes generally downward from the lower surface of the main portion. Also, the rib is closed to completely encircle a vertical center axis of the main portion.

In another aspect, the present invention provides a method of manufacturing a wafer holder. According to the method, a main portion is formed of a first material. The main portion has an upper surface and a lower surface, the upper surface having a larger surface area than the lower surface. A rib is also formed of the first material, the rib protruding generally vertically from the main portion. The main portion and the rib are heated to a heated state. The main portion and the rib are together covered in the heated state with a coating of a second material. The main portion and the rib are allowed to cool.

In yet another aspect, the present invention provides a method of manufacturing a wafer holder. According to the method, a main portion is formed of graphite. The main portion has an upper surface and a lower surface, the upper surface having a larger surface area than the lower surface. A rib is also formed of graphite, the rib being integral with and protruding generally downward from the lower surface of the main portion. The rib is closed to surround a vertical center axis of the main portion. The main portion and the rib are heated to at least about 1500° C. Then, the main portion and the rib are together coated with silicon carbide and allowed to cool.

For purposes of summarizing the invention and the advantages achieved over the prior art, certain objects and advantages of the invention have been described above and as further described below. Of course, it is to be understood that not necessarily all such objects or advantages may be achieved in accordance with any particular embodiment of the invention. Thus, for example, those skilled in the art will recognize that the invention may be embodied or carried out in a manner that achieves or optimizes one advantage or group of advantages as taught herein without necessarily achieving other objects or advantages as may be taught or suggested herein.

These aspects and others are intended to be within the scope of the invention herein disclosed, as will become readily apparent to those skilled in the art from the following detailed description of the preferred embodiments having reference to the attached figures, the invention not being limited to any particular preferred embodiment(s) disclosed.

BRIEF DESCRIPTION OF THE DRAWINGS

FIG. 2 is a top plan view of a wafer holder according to one embodiment of the invention;

FIG. 3 is a bottom plan view of the wafer holder of FIG. 2;

FIG. 4 is a partial cross-sectional view of the wafer holder of FIG. 2, taken along lines 4—4 of FIG. 2;

DETAILED DESCRIPTION OF THE PREFERRED EMBODIMENTS

U.S. Pat. No. 5,403,401 provides one method of eliminating saddling, but also prevents symmetrical dishing, such that no concavity forms during the ordinary formation process. However, it has been determined that the concavity actually improves the temperature uniformity across the wafer during processing. Without being limited by theory, it is believed that the concavity is beneficial in increasing the volume under the wafer for gas flow during wafer pickup and drop off, inhibiting wafer stick and slide, respectively. Furthermore, it is believed that concavity prevents exacerbation of wafer curl, due to thermal shock upon wafer drop off, by inhibiting exclusive contact at the wafer center during initial wafer curl. Instead, the wafer tends to conform somewhat to the concavity during initial wafer curl such that more uniform heat transfer can occur and alleviate the thermal gradients that cause the curl. Thus, it is often preferred to form the grid structure on the upper surface and maintain a generally flat bottom surface.

Figure 1:
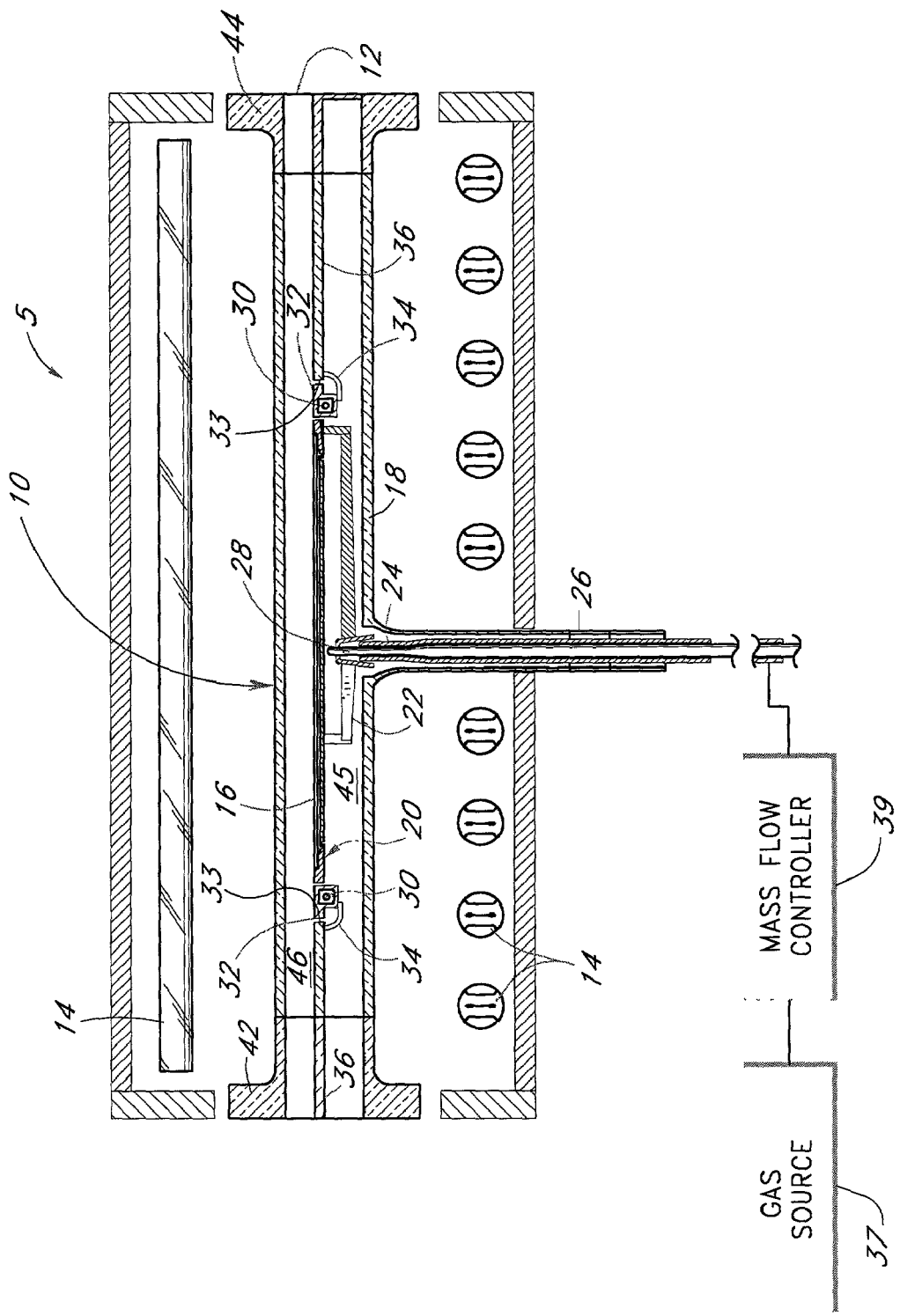
FIG. 1 is a schematic, cross-sectional view of an exemplary reaction chamber within which a wafer holder in accordance with the preferred embodiments can be employed.

FIG. 1 illustrates a reactor 5, including one type of reaction chamber 10 within which a wafer bolder according to the preferred embodiments can be inserted and used. The illustrated reaction chamber 10 is a cold wall reaction chamber including a wafer holder in the form of a susceptor 20. It will be understood that the wafer holder need not be a susceptor in order to benefit from the principles and advantages described herein. The chamber 10 comprises a quartz tube defined by an upper wall 15, a lower wall 18, an upstream flange 42, and a downstream flange 44. Although not shown in the figure, lateral edges of the reaction chamber 10 include relatively thick side rails between which a chamber divider plate 36 is attached. FIG. 1 is a longitudinal cross-section along a central vertical plane of the chamber 10 illustrating its vertical dimension; the side rails are thus not seen. Preferably, the chamber 10 is manufactured from quartz. The chamber divider plate 36 reinforces the chamber 10 during vacuum processing and extends between the side rails (not shown), preferably along the centerline of the chamber 10. The divider plate 36 includes an aperture 33 defining a void or opening extending across the lateral dimension of the chamber 10 between the side rails. The aperture 33 divides the divider plate 36 into an upstream section extending from the upstream flange 42 to an upstream edge of the aperture 33, and a downstream section extending from a downstream edge of the aperture to the downstream flange 44. The upstream section of the divider plate 36 is preferably shorter in the longitudinal direction than the downstream section.

An elongated tube 26 depends from a centrally located region of the lower wall 18. A drive shaft 24 extends through the tube 26 and into a lower region 45 of the chamber 10. The lower region 45 is defined between the central chamber divider plate 36 and the lower wall 18. The upper end of the drive shaft 24 is tapered to fit within a recess of a multi-armed support or spider assembly 22 for rotating the susceptor 20. The susceptor 20 supports a wafer 16. A motor (not shown) drives the shaft 24 to, in turn, rotate the susceptor 20 and wafer 16 loaded thereon within the aperture 33. A gas injector (not shown) is configured to introduce process gas into an upper region 46 of the chamber 10. The upper region 46 is defined between the upper wall 15 and the central chamber divider plate 36. The process gas passes over the top surface of the loaded wafer 16 to conduct processing (e.g., deposition) thereon.

The system typically includes a plurality of radiant heat elements arrayed around the outside of the reaction chamber 10 for heating the wafer 16 and catalyzing the chemical reactions thereon. In the illustrated reactor 5, an upper bank of elongated heat lamps 14 is positioned outside of the upper wall 15, and a lower bank of lamps 14 arranged cross-wise to the upper bank is also utilized. Further, an array of spot lamps (not shown) directed upward from underneath the susceptor 20 is often used.

The susceptor system can optionally include means for providing gas flow, particularly inert gas flow (e.g., $H_2$, $N_2$, Ar or He, depending upon the process being conducted) to the wafer underside, to help prevent backside deposition. In the illustrated embodiment, a source of gas 37 is schematically shown connected through a mass flow controller 39 to the drive shaft 24. The gas source 37 is preferably provided with the ability to control the temperature of the gas via heaters or the like, which are not depicted in the figure. Gas flows into the space within the hollow shaft 24 and is eventually directed upward through the susceptor 20. The fluid coupling that allows gas to flow into the hollow, rotating shaft 24 is not shown, but may be accomplished by a number of different means, one of which is shown and described in U.S. Pat. No. 4,821,674.

A wafer 16 can be inserted into the reaction chamber 10 through a wafer entry port (not shown) upstream of the reaction chamber 10. The wafer 16 is typically transported by a robotic pick-up arm having an attached end effector, such as a Bernoulli wand, which enters through the entry port and extends over the susceptor 20 to deposit the wafer 16 thereon. After the robotic pick-up arm is retracted from the reaction chamber 10, the CVD system then seals the chamber and, after temperature stabilization and purging, introduces process gas for depositing a layer of silicon or other material on the wafer. After processing, a gate valve opens and the robotic pick-up arm enters through the wafer entry port and retracts the wafer 16 from the susceptor 20. Preferably, the reaction chamber 10 is periodically conditioned for subsequent processing. A typical conditioning sequence comprises the introduction of an etch gas into the reaction chamber with the gate valve closed to clean deposits from the support structures and interior walls. After the etching, a silicon precursor is sometimes introduced into the chamber to provide a thin coat of silicon on the susceptor 20. Such a coating step is sometimes termed "capping" and serves to stabilize emissivity of the susceptor relative to subsequent deposition cycles of silicon on subsequent wafers. After the etching and capping steps, the chamber 10 is purged with hydrogen for introduction of the next wafer.

The tube 26 is sized slightly larger than the drive shaft 24 to provide space therebetween through which purge gas preferably flows. The purge gas enters the lower region 45 of the reaction chamber 10 to help prevent reactant gas from depositing in the lower region. In this respect, the purge gas creates a positive pressure below the susceptor 20, which helps prevent reactant gas from traveling downward around the sides of the susceptor into the lower region 45. The purge gas is then exhausted between the susceptor 20 and aperture 33 into the upper region 46 and then through an elongated exit slot (not shown) in the downstream flange 44. This minimizes risk of reactant gases migrating into the lower region 45. After passing through the exit slot, the purge gas continues through an exhaust system. Any excess reactant gas and reactant by-product likewise passes through the exit slot in the downstream flange 44 to be vented through the exhaust system.

Preferably, a temperature compensation ring 32, also referred to as a slip ring, surrounds the susceptor 20. The ring 32 fits in the aperture 33, and the susceptor 20 and ring 32 together substantially fill the opening and provide structure between the lower and upper chamber regions 45 and 46. The susceptor 20 rotates within the ring 32 and is preferably spaced therefrom across a small annular gap of between 0.5 and 1.5 mm. The shape of the aperture 33 in the divider plate 36 surrounding the ring 32 can be made circular so that the edges of the opening created by the aperture 33 are in close proximity to the ring. Alternatively, the ring 32 may have a rounded rectangular outer periphery and the aperture 33 a matching boundary. Multiple susceptors are preferably manufactured to have a constant outer diameter to fit within the ring 32. Although the susceptors have a constant outer diameter, it will be understood that various configurations are provided for processing a number of different size wafers.

In a particularly advantageous embodiment, the temperature compensation ring 32 comprises a two-part circular ring having a cavity therein for receiving thermocouples 30. In a preferred embodiment, the thermocouples 30 enter the chamber 10 through apertures formed in the downstream flange 44 and extend underneath the divider plate 36 into the temperature compensation ring 32. The apertures in the quartz flange 44 substantially prevent gas leakage around the thermocouples 30, although typically no additional seal is used. There are preferably three such thermocouples, one terminating at a leading edge of the susceptor 20, one terminating at a trailing edge, and one (not shown) terminating at either of the lateral sides of the ring 32. The thermocouples within the ring 32 surrounding the susceptor 20 provide temperature information feedback for accurate control of the radiant heating lamps 14. A plurality of bent fingers or elbows 34 attached to the divider plate 36 support the ring 32 around the periphery of the susceptor 20. In addition to the temperature compensation ring 32 and thermocouples therein, a central thermocouple 28 extends upward through the drive shaft 24, which is constructed hollow, and through the spider assembly 22 to terminate underneath the center of the susceptor 20. The central thermocouple 28 thus provides an accurate gauge of the temperature near the center of the wafer 16.

In addition to housing the thermocouples 30, the temperature compensation ring 32 absorbs radiant heat during high temperature processing. This compensates for a tendency toward greater heat loss at the wafer edge, a phenomenon that is known to occur due to a greater concentration of surface area for a given volume near such edges. By minimizing edge losses and the attending radial temperature non-uniformities across the wafer, the temperature compensation ring 32 can help to prevent crystallographic slip and other problems associated with temperature non-uniformities across the wafer. While the illustrated temperature compensation ring 32 rests upon elbows 34 that depend from the quartz chamber divider plate 36, the ring 32 can be suspended by any suitable means.

FIGS. 2–5 illustrate one embodiment of a wafer holder 20 according to the present invention. The illustrated wafer holder is a susceptor capable of absorbing radiant energy from radiant heating elements, such as the heat lamps 14 shown in FIG. 1. The susceptor 20 is preferably made of graphite coated with silicon carbide, although the skilled artisan will appreciate that other materials can alternatively be used. The illustrated susceptor 20 is of a type considerably larger than the wafer to be supported, preferably more than five times and more preferably between about 7 and 9 times the thermal mass of the wafer, such that it can serve as a "thermal flywheel" to maintain temperature stability. In one embodiment, the susceptor 20 is solid, i.e., does not contain openings therethrough. Such openings risk backside deposition as well as alter thermal properties. In another embodiment, the susceptor has openings for receiving gas flow to prevent backside deposition (as disclosed in U.S. Pat. No. 6,053,982) and/or to assist in loading and unloading of the wafer (as disclosed in U.S. Patent Application Publication No. US 2003/0168174 A1). In the preferred embodiment, except as otherwise noted herein, the illustrated susceptor 20 is configured similarly to the susceptors disclosed and described in U.S. Pat. No. 6,634,882.

FIG. 2 shows the susceptor 20 as viewed from the top, looking into a recessed pocket 102 sized and shaped to closely accommodate a particular class of substrate. The pocket 102 is defined by a raised outer shoulder 106 and an inner pocket surface 109. The shoulder 106 surrounds and has an upper surface 107 positioned higher than the inner pocket surface 109. The inner pocket surface 109 is preferably concave with respect to the upper shoulder surface 107, but can alternatively be generally planar. In the illustrated embodiment, the pocket 102 has a set of perpendicular, crossing grid grooves that are cut into the surface 109 and surrounded by an annular groove 104 radially inward of the shoulder 106. While shown across only a portion of the susceptor pocket 102, it will be appreciated that the grid extends across the full susceptor pocket 102 up to the annular groove 104. In an exemplary embodiment designed to support 200-mm wafers, the diameter to the outer edge of the annular groove 104 (inner wall of the shoulder 106) is about 8.000±0.005 inches, or slightly larger than the wafer to be supported, and the overall diameter of the susceptor 20 is about 8.850=0.005 inches. In an embodiment designed to support 100-mm wafers, the diameter to the outer edge of the annular groove 104 is about 4.000±0.005 inches. In an embodiment designed to support 150-mm wafers, the diameter to the outer edge of the annular groove 104 is about 6.000±0.005 inches. In embodiments having a concave surface 109, the tops of the grid protrusions along the circumference closest to the edge of the pocket 102 define a plane on which the wafer rests. This plane is preferably between about 0.010 and 0.025 inches, more preferably between 0.015 and 0.020 inches, and most preferably about 0.018 inches below the top surface 107 of the annular, raised shoulder 106, about 0.010 inches less than the thickness of a standard 200-mm wafer.

Preferably, for a susceptor 20 designed to hold a 150-mm wafer, the grooves that define the grid structure on the pocket surface 109 define a total volume preferably at least about $7.5 \times 10^{-6}$ $m^3$ and more preferably at least about $8.0 \times 10^{-6}$ $m^3$. For a susceptor 20 designed to hold a 200-mm wafer, the grooves that define the grid structure on the pocket surface 109 define a total volume preferably at least about $1.3 \times 10^{-5}$ $m^3$ and more preferably at least about $1.4 \times 10^{-5}$ $m^3$. For a susceptor 20 designed to hold a 300-mm wafer, the grooves that define the grid structure on the pocket surface 109 define a total volume preferably at least about $3.0 \times 10^{-5}$ $m^3$ and more preferably at least about $3.5 \times 10^{-5}$ $m^3$.

Preferably, for a susceptor 20 designed to hold a 150-mm wafer, the total surface area of the susceptor's upper surface is at least 70 $in^2$, and more preferably at least 80 $in^2$, while in practice the total surface area of the susceptor's lower surface is generally no more than 60 $in^2$. For a susceptor 20 designed to hold a 200-mm wafer, the total surface area of the susceptor's upper surface is at least 120 $in^2$, and more preferably at least 130 $in^2$, while in practice the total surface area of the susceptor's lower surface is generally no more than 60 $in^2$. For a susceptor 20 designed to hold a 300-mm wafer, the total surface area of the susceptor's upper surface is at least 260 $in^2$, and more preferably at least 280 $in^2$, while in practice the total surface area of the susceptor's lower surface is generally no more than 130 $in^2$. For all embodiments having a gridded surface 109, the ratio of the surface area of the susceptor's upper surface to the surface area of the susceptor's lower surface is typically greater than about 4:1, more preferably within about 3:1 to 4:1, and most preferably within about 2:1 to 3:1. In a preferred embodiment, such ratio is about 2.13:1. In general, it is preferred that such ratio be as close as possible to 1:1 to reduce the tendency to saddle, notwithstanding the effect of the stiffening rib 118 (FIGS. 3 and 4) to reduce saddling, as explained below.

A bottom plan view of the susceptor 20 is shown in FIG. 3. The susceptor 20 comprises a main portion 101. The main portion 101 is preferably circular and disc-shaped, and includes the above-described pocket 102 in its upper surface. The bottom surface 110 of the main portion 101 preferably includes a bottom groove 114, in the preferred embodiment about 0.250 inches in width and having a rectangular cross-section. The groove 114 is concentric with the vertical center axis of the susceptor 20 and in the preferred embodiment has an outer diameter of about 5.250±0.005 inches. The groove 114 does not form a complete circle. Rather, it is interrupted by a section 116, shown on the right side of FIG. 3. The illustrated interrupting section 116 has a length of about 0.250 inches. The bottom groove 114 accepts fingers of the spider 22 (FIG. 1). The interrupting section 116 ensures that the spider 22 cannot rotate independently of the susceptor 20 once it has locked in position against section 116. In other arrangements, three separate recesses can be provided to receive fingers of the spider.

As shown in FIGS. 3 and 4, a stiffening rib 118 is formed on and protrudes generally downward from the underside 110 of the main portion 101. Preferably, the rib 118 is closed to completely surround the vertical center axis of the main portion 101. The rib 118 is preferably circular, concentric with the susceptor periphery and formed integrally with the main portion 101. In the preferred embodiment, the rib 118 and the main portion 101 are formed together from graphite and then together coated with silicon carbide.

FIG. 4 is a cross-sectional view of an area of the susceptor 20 near the periphery, taken along lines 4—4 of FIG. 2. In the illustrated embodiment, the rib 118 has a substantially rectangular cross-section extending downwardly from the main portion 101, with a substantially uniform height $H_r$ and a substantially uniform width $W_r$. The ratio of the height $H_r$ to the width $W_r$ is preferably at least 1:1, more preferably at least 2:1, more preferably at least 3:1, more preferably at least 5:1, and more preferably at least 10:1. Also, the height $H_r$ of the rib 118 is preferably greater than 20%, and more preferably greater than 50% of the height $H_m$ of the main portion 101. For a susceptor 20 designed to process 200-mm wafers, the height $H_r$ of the rib 118 is preferably within 1–4-mm and more preferably within 1–3 mm, while the width $W_r$ is preferably within 2–9 mm and more preferably within 3–6 mm. For a susceptor designed to process 300-mm wafers, the height $H_r$ of the rib 118 is preferably within 1–6 mm and more preferably within 2–4 mm, while the width $W_r$ is preferably within 1–6 mm and more preferably within 1–4 mm.

The rib 118 helps to prevent the susceptor 20 from "saddling" (asymmetric "dishing") during manufacturing or use, as described in the Background section above. In the same manner that a beam with an I-shaped or T-shaped cross-section is more resistant to bending than a flat beam, the illustrated susceptor 20 with the rib 118 is more resistant to bending about axes perpendicular to the susceptor's vertical center axis than a susceptor without the rib. Accordingly, the shoulder 106 remains circular and level, despite thermally induced concavity, as will be better understood in view of FIG. 6 and attending description. In a preferred embodiment, the rib 118 makes a susceptor designed to hold 200-mm wafers about 3.5 times stiffer than it would be without the rib. In a preferred embodiment, the rib 118 makes a susceptor designed to hold 300-mm wafers about 2.0 times stiffer than it would be without the rib.

The stiffening rib 118 can be positioned anywhere on the underside of the susceptor 20 but is preferably close to the outer radial edge thereof. In FIGS. 3 and 4, the rib 118 is positioned on the underside of the shoulder 106 of the main portion 101. In an alternative configuration, shown in FIG. 5, the rib 118 is positioned directly below the pocket 102 of the main portion 101, slightly radially inward of the shoulder 106. It will also be understood that the rib 118 can be positioned directly below the interface between the pocket 102 and the shoulder 106.

Figure 5:
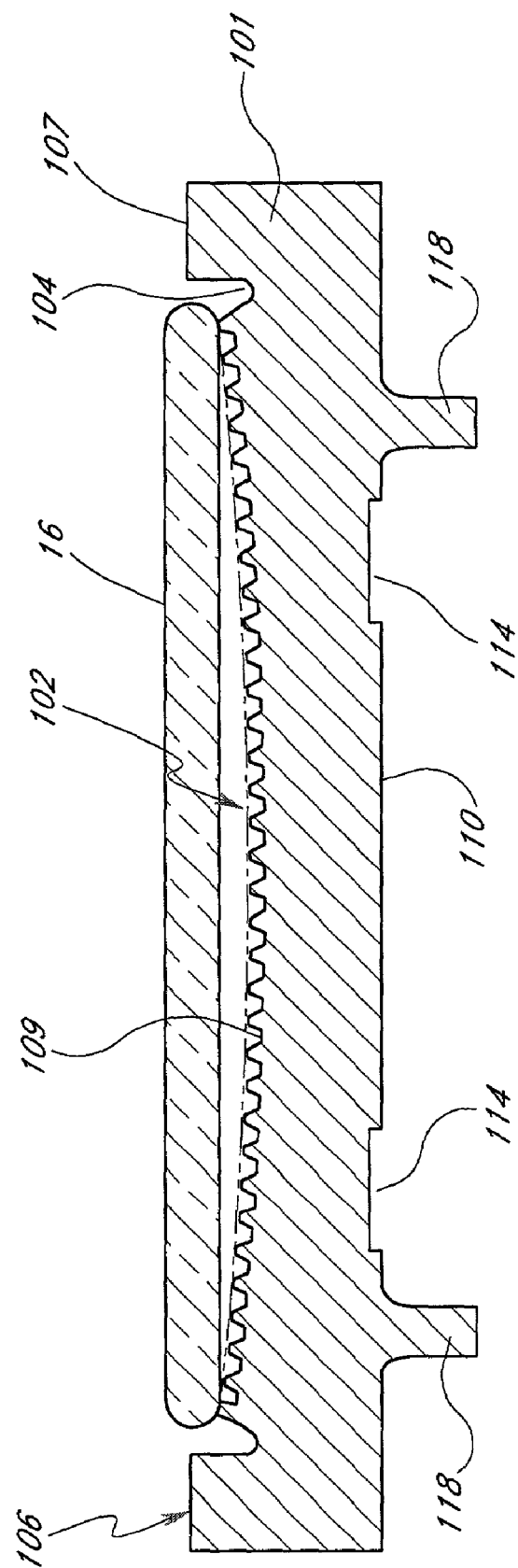
FIG. 5 is a schematic cross-sectional view of the wafer holder of FIG. 2, shown with an exaggerated concavity and a wafer held thereon.

FIG. 5 also illustrates a concavity in the upper surface of the pocket 102, the concavity being exaggerated for purposes of illustration. The rib 118 helps to maintain a more symmetrical and uniform concavity of the pocket surface 109. In this context, concavity at any point on the pocket surface 109 is measured by the vertical distance from such point to the plane defined by outer edge of the pocket 102. "Uniform" means a constant concavity along every circle centered at the center of the pocket 102. In other words, a uniform concavity means that for a given radial distance from the center of the pocket 102, the concavity does not vary depending upon the angular position with respect to the center of the pocket. Also, the concavity may have a perfect "bowl" shape or constant radius of curvature. More particularly, at least the outermost grid protrusions fall in the same plane.

Figure 6:
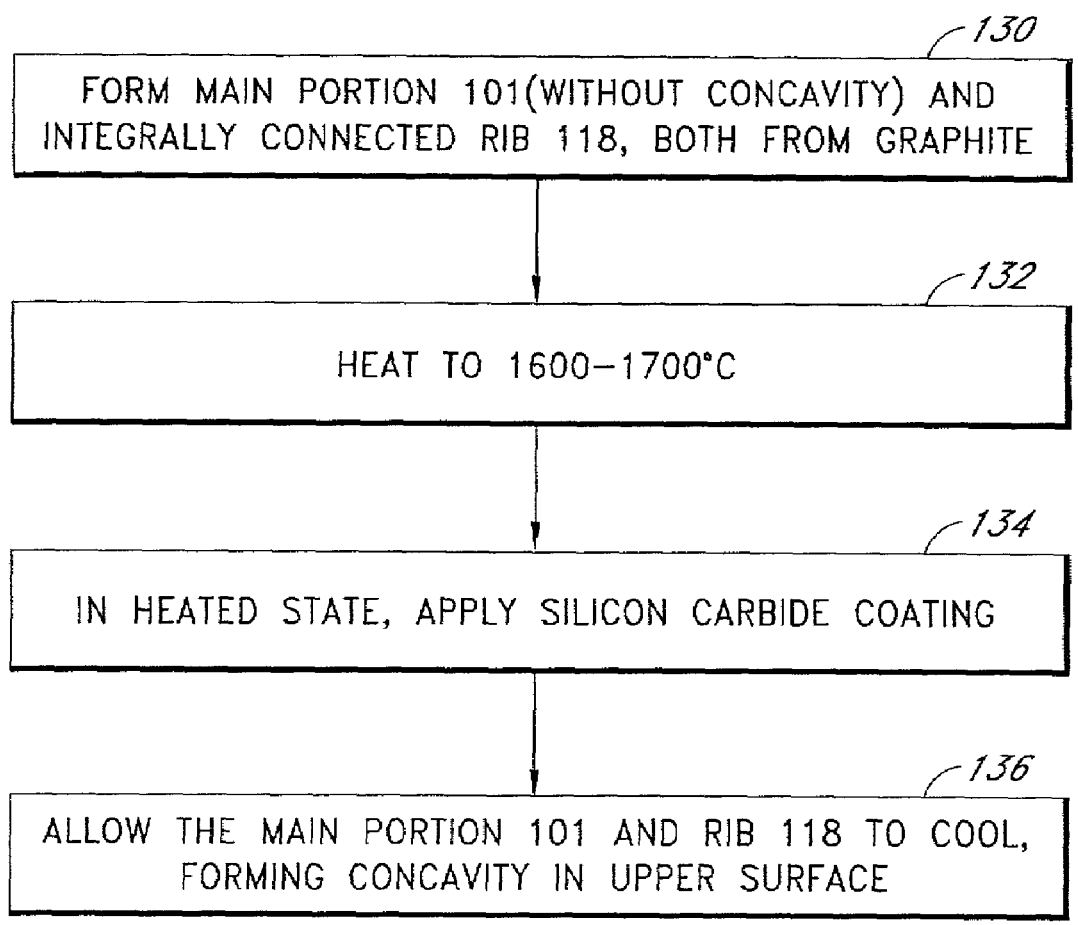
FIG. 6 is a flow diagram illustrating a method of manufacturing a wafer holder according to the present invention.

FIG. 6 is a flow diagram illustrating a method of manufacturing a susceptor having features in accordance with the present invention. According to the method, in step 130 the main portion 101 and the rib 118 are formed integrally with one another, preferably from graphite. Alternatively, they could be formed separately and then attached together. Preferably, the main portion 101 is formed with the wafer-receiving pocket 102 and the grid structure therein (see FIGS. 2, 4, and 5), but without a concavity in the pocket surface 109. In step 132, the main portion 101 and rib 118 (collectively, "the part") are heated to a temperature sufficiently high to de-gas the part, preferably to greater than about 1500° C. and more preferably to about 1600–1700° C. In other words, the part is heated to remove impurities and/or gases trapped within the graphite, as graphite is inherently a "dirty" material. In step 134, a coating of silicon carbide is applied to the part while in a heated state. It will be appreciated that between steps 132 and 134, the part is typically cooled and then reheated. Then, in step 136, the part is permitted to cool down, preferably by annealing, during which a concavity forms in the pocket surface 109 due to thermal stresses caused by the differences in rates of thermal expansion of the core and coating. Advantageously, the rib 118 helps to prevent saddling of the wafer holder, provides a flatter upper shoulder surface 107, and improves the uniformity of the concavity in the pocket surface 109.

Although this invention has been disclosed in the context of certain preferred embodiments and examples, it will be understood by those skilled in the art that the present invention extends beyond the specifically disclosed embodiments to other alternative embodiments and/or uses of the invention and obvious modifications and equivalents thereof. Further, the various features of this invention can be used alone, or in combination with other features of this invention other than as expressly described above. Thus, it is intended that the scope of the present invention herein disclosed should not be limited by the particular disclosed embodiments described above, but should be determined only by a fair reading of the claims that follow.

We claim:

1. A wafer holder comprising:
   a main portion having an upper surface and a lower surface, a ratio of surface area of the upper surface to surface area of the lower surface being greater than about 2.0; and
   a rib formed integrally with and on the main portion, the rib protruding generally downward from the lower surface of the main portion, the rib being closed to completely encircle a vertical center axis of the main portion.

2. The wafer holder of claim 1, wherein the main portion is generally circular and disc-shaped.

3. The wafer holder of claim 1, wherein the upper surface of the main portion includes a grid formed by grooves in the upper surface.

4. The wafer holder of claim 3, wherein the grooves define a total volume of at least about $1.3 \times 10^{-5}$ m$^3$.

5. The wafer holder of claim 3, wherein the grooves define a total volume of at least about $3.0 \times 10^{-5}$ m$^3$.

6. The wafer holder of claim 3, wherein the surface area of the upper surface is at least about 260 in$^2$.

7. The wafer holder of claim 3, wherein the surface area of the upper surface is at least about 120 in$^2$.

8. The wafer holder of claim 1, wherein the main portion and the rib are formed integrally with one another.

9. The wafer holder of claim 1, wherein the main portion and the rib are formed of graphite and coated with silicon carbide.

10. The wafer holder of claim 1, wherein the rib has a substantially rectangular cross-section.

11. The wafer holder of claim 10, wherein the rib has a substantially uniform height, wherein the height of the rib is greater than 20% of the height of the main portion.

12. The wafer holder of claim 10, wherein the rib has a substantially uniform height, wherein the height of the rib is greater than 50% of the height of the main portion.

13. The wafer holder of claim 1, wherein the rib has a substantially uniform height and a width, a ratio of the height to the width being at least about 1:1.

14. The wafer holder of claim 1, wherein the rib has a substantially uniform height and a width, a ratio of the height to the width being at least about 2:1.

15. The wafer holder of claim 1, wherein the upper surface of the main portion includes a wafer-receiving pocket defined by an outer shoulder and an inner pocket surface, the outer shoulder having an upper surface and encircling the inner pocket surface, the inner pocket surface being positioned lower than the upper surface of the outer shoulder, the inner pocket surface being concave with respect to the upper surface of the outer shoulder.

16. The wafer holder of claim 15, wherein the wafer-receiving pocket is sized and adapted to closely receive a wafer of a particular size, the rib being positioned below the inner pocket surface.

17. The wafer holder of claim 15, wherein the wafer-receiving pocket is sized and adapted to closely receive a wafer of a particular size, the rib being positioned below the outer pocket.

18. The wafer holder of claim 1, wherein the upper surface of the main portion includes a wafer-receiving pocket defined by an outer shoulder and an inner pocket surface, the outer shoulder having a substantially flat upper surface and encircling the inner pocket surface, the inner pocket surface being positioned lower than the upper surface of the outer shoulder.

19. The wafer holder of claim 1, wherein the wafer holder comprises a susceptor.

20. A cold wall reactor for processing semiconductor wafers, comprising:
 a reaction chamber;
 an upper array of radiant heat elements above the reaction chamber;
 a lower array of radiant heat elements below the reaction chamber; and
 a wafer holder inside the reaction chamber, comprising:
  a main portion having an upper surface and a lower surface, a ratio of surface area of the upper surface to surface area of the lower surface being greater than about 2.0:1; and
  a rib formed integrally with and protruding generally vertically from the main portion, the rib being closed to completely surround a vertical center axis of the main portion.

21. The reactor of claim 20, wherein the upper surface of the main portion is generally concave.

22. The reactor of claim 20, wherein the upper surface of the main portion includes a wafer-receiving pocket defined by an outer shoulder and an inner pocket surface, the outer shoulder having a substantially flat upper surface and surrounding the inner pocket surface, the inner pocket surface being positioned lower than the upper surface of the outer shoulder.

23. The reactor of claim 20, wherein the rib extends generally downward from the lower surface of the main portion.

24. The reactor of claim 20, wherein a grid is formed by intersecting grooves in the upper surface of the main portion.

* * * * *